US012763156B2

(12) United States Patent
Cao et al.

(10) Patent No.: US 12,763,156 B2
(45) Date of Patent: Oct. 13, 2026

(54) NON-VOLATILE MEMORY WITH PROGRAM-VERIFY AT COMMON VOLTAGE

(71) Applicant: Sandisk Technologies, Inc., Milpitas, CA (US)

(72) Inventors: Wei Cao, Fremont, CA (US); Muhammad Masuduzzaman, Chandler, AZ (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 91 days.

(21) Appl. No.: 18/601,389

(22) Filed: Mar. 11, 2024

(65) Prior Publication Data

US 2025/0285688 A1 Sep. 11, 2025

(51) Int. Cl.
*G11C 16/34* (2006.01)
*G11C 16/10* (2006.01)
*G11C 16/26* (2006.01)

(52) U.S. Cl.
CPC ........ *G11C 16/3459* (2013.01); *G11C 16/102* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 8,873,285 | B2 | 10/2014 | Sharon et al. | |
| 8,942,047 | B2 | 1/2015 | Mui et al. | |
| 9,564,213 | B2 | 2/2017 | Sun et al. | |
| 9,576,673 | B2 | 2/2017 | Jiang et al. | |
| 10,643,695 | B1 * | 5/2020 | Nguyen | G11C 11/5628 |
| 10,910,060 | B1 * | 2/2021 | Wu | G11C 16/08 |
| 11,532,370 | B1 | 12/2022 | Yang et al. | |
| 2007/0171744 | A1 * | 7/2007 | Mokhlesi | G11C 16/0483 365/203 |
| 2016/0099070 | A1 * | 4/2016 | Jiang | G11C 16/26 365/185.21 |
| 2023/0290405 | A1 | 9/2023 | Wang et al. | |
| 2023/0315330 | A1 * | 10/2023 | Li | G06F 3/0655 |
| 2024/0079066 | A1 * | 3/2024 | Wu | G11C 29/08 |

* cited by examiner

*Primary Examiner* — Alfredo Bermudez Lozada
(74) *Attorney, Agent, or Firm* — PEARL COHEN LLP

(57) ABSTRACT

A memory system has been described that uses the same word line voltage for verifying and reading multiple (or all) data states such that both program-verify and read operations comprise sensing for different current levels in response to the same word line voltage.

15 Claims, 21 Drawing Sheets

NON-VOLATILE MEMORY WITH PROGRAM-VERIFY AT COMMON VOLTAGE

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users typically store data that is important to them, it is desired to reduce the chance of errors when using non-volatile data.

BRIEF DESCRIPTION OF THE DRAWINGS

Like-numbered elements refer to common components in the different figures.

DETAILED DESCRIPTION

A memory system is proposed that uses the same word line voltage for verifying and reading multiple (or all) data states such that both program-verify and read operations comprise sensing for different current levels in response to the same word line voltage. Such an arrangement can reduce the chance of errors when reading data stored in non-volatile memory.

In one set of embodiments, the non-volatile memory system performs a programming process to program a first set of non-volatile memory cells to multiple data states. Each data state corresponds to a different threshold voltage distribution. During the programming process, the system performs program-verify for the first set of non-volatile memory cells including applying a first word line voltage to gates of the first set of non-volatile memory cells (via a common word line connected to the first set of non-volatile memory cells) for verifying memory cells being concurrently programmed to multiple (or all) data states and sensing for different current levels for different data states of the multiple data states. The first word line voltage is also used to perform read operations, including sensing current in response to applying the first word line voltage to the first set of non-volatile memory cells.

Figure 1:
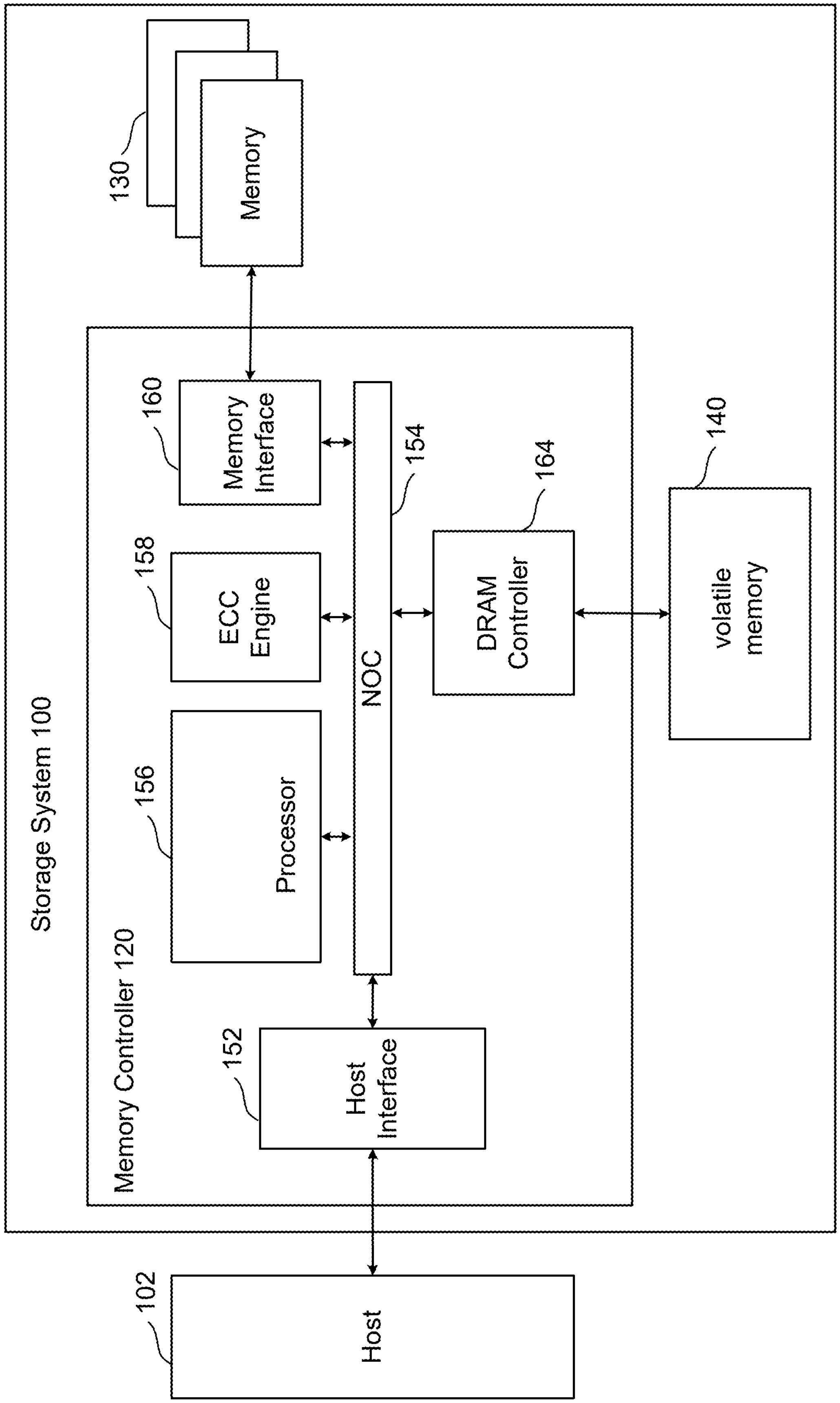
Figure 1 (Prior Art)
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface 160 provides a Toggle Mode interface. Other interfaces can also be used. In some example implementations, memory interface 160 (or another portion of controller 120) implements a scheduler and buffer for transmitting data to and receiving data from one or more memory die.

Figure 2A:
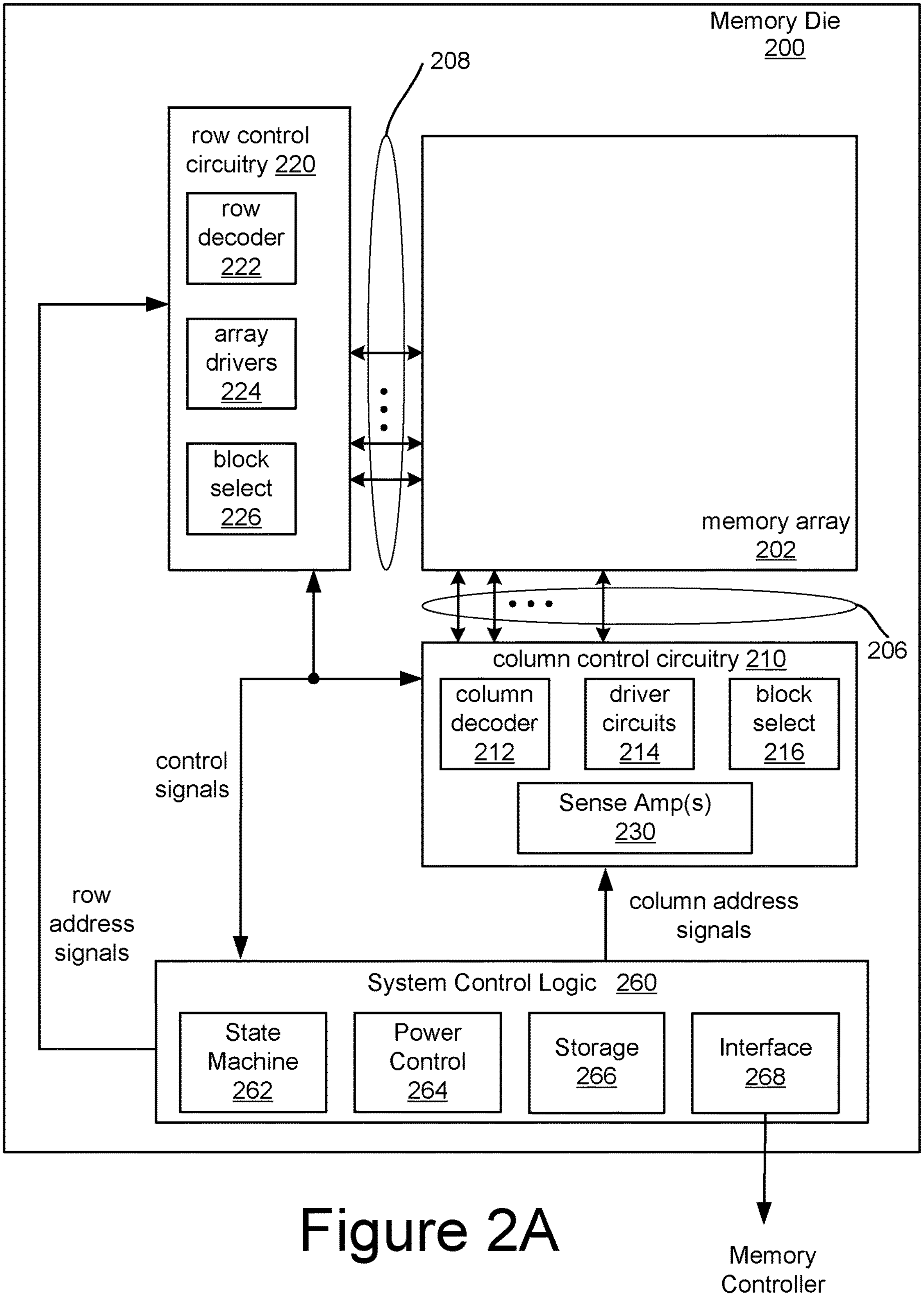
FIG. 2A is a block diagram of one embodiment of a memory die.

In one embodiment, non-volatile memory 130 comprises one or more memory die. FIG. 2A is a functional block diagram of one embodiment of a memory die 200 that comprise non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for memory array 202, a memory die 200 can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReReAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
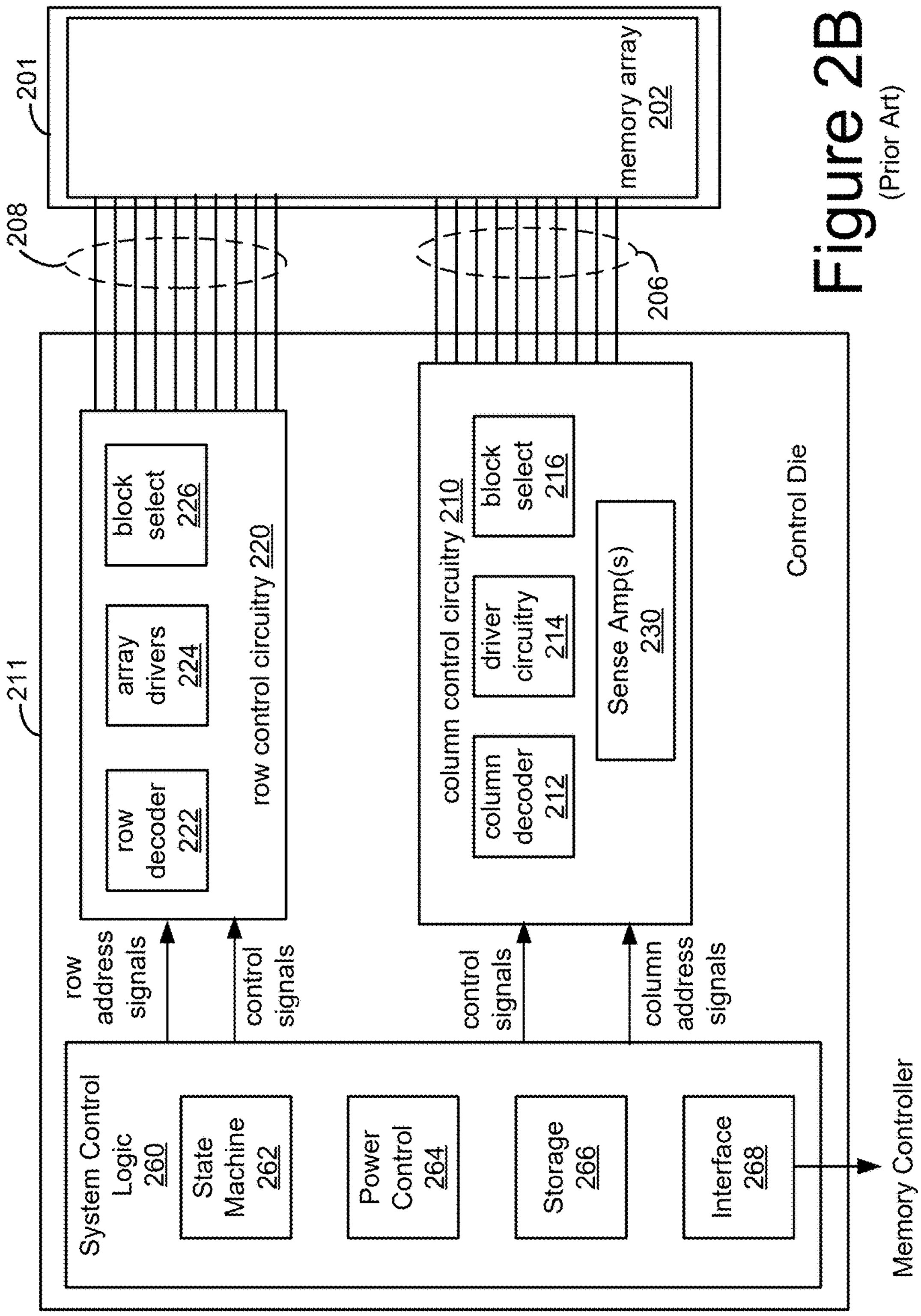
Figure 2B (Prior Art)
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
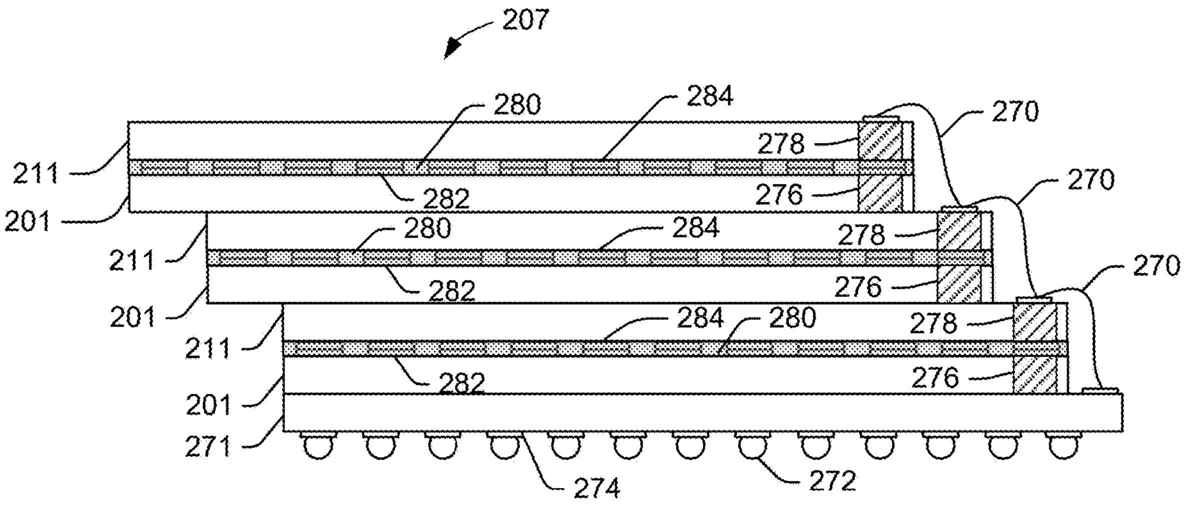
Figure 3A (Prior Art)
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
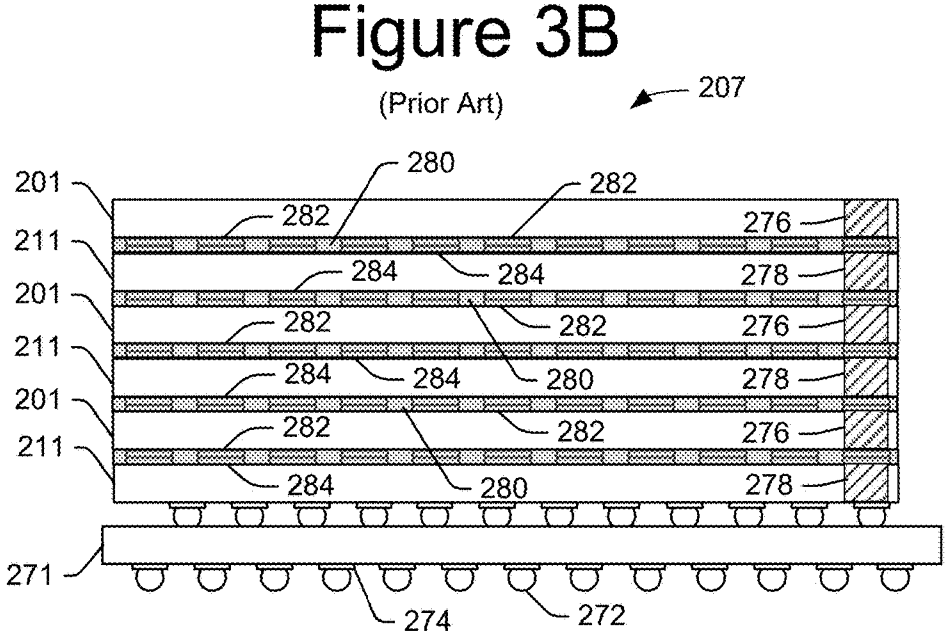
Figure 3B (Prior Art)

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on the surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
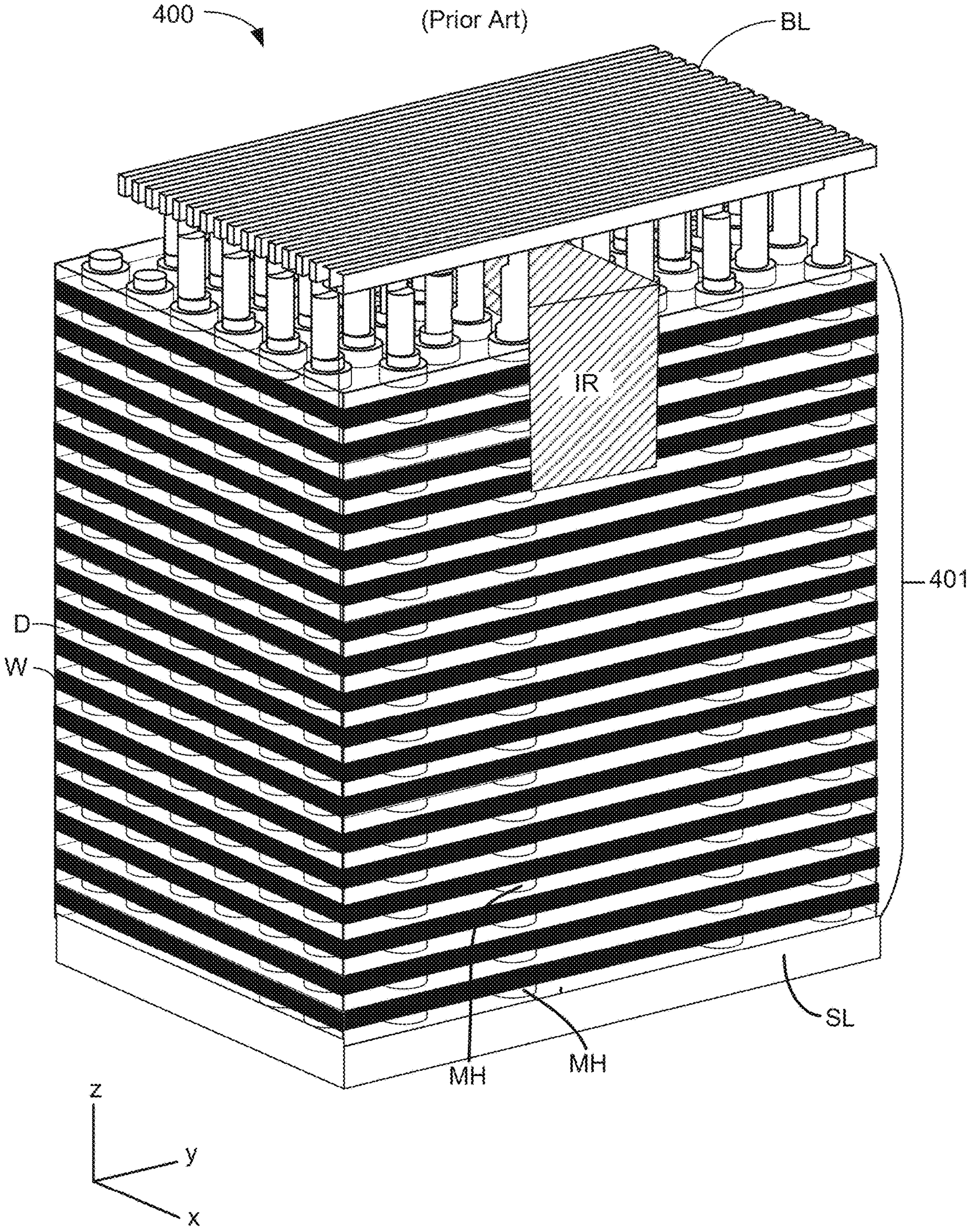
Figure 4 (Prior Art)
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
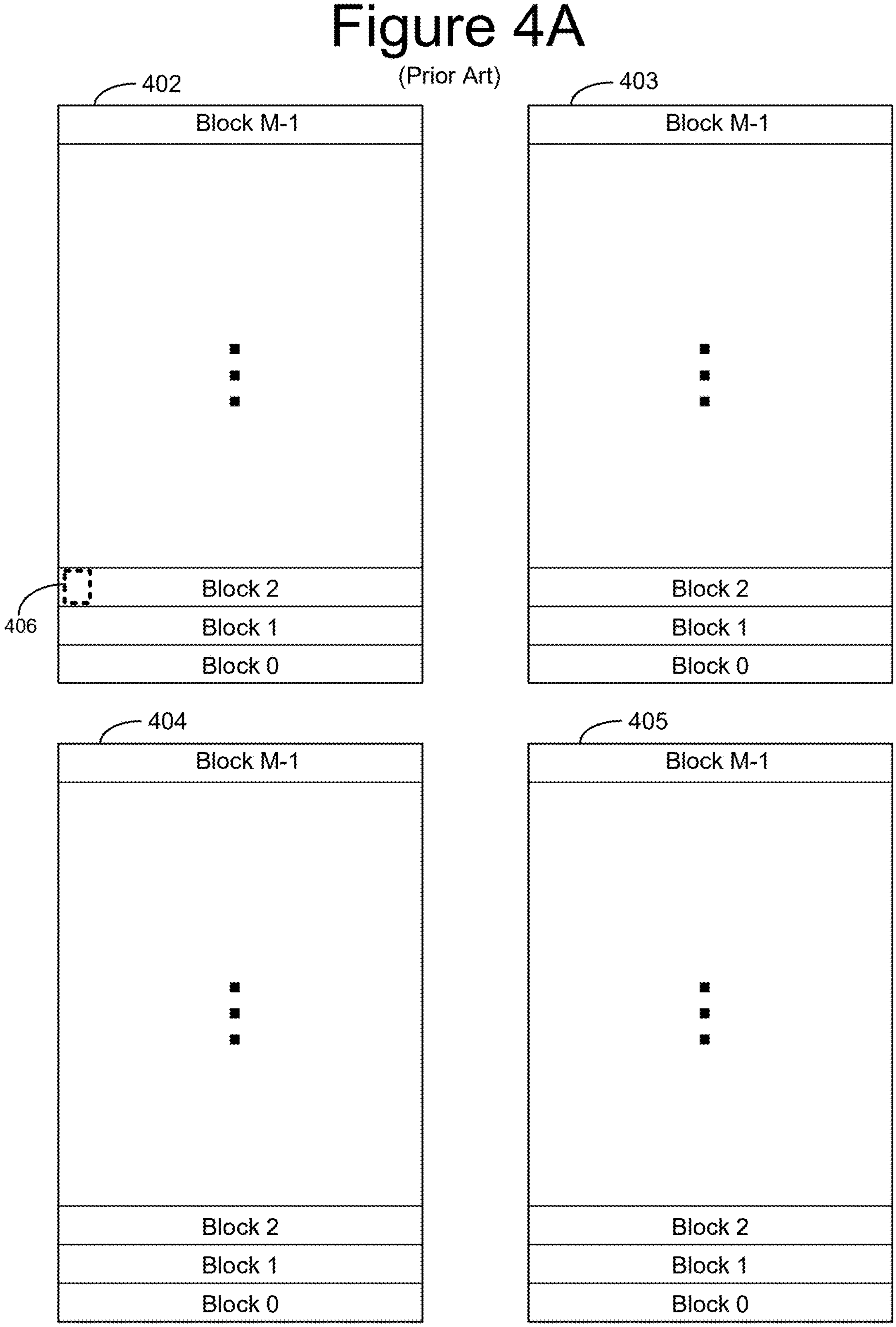
Figure 4A (Prior Art)
FIG. 4A is a block diagram of one embodiment of a memory structure having two planes.

FIG. 4A is a block diagram explaining one example organization of memory structure 202, which is divided into four planes 402, 403, 404 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows four planes, more or less than four planes can be implemented. In some embodiments, memory structure 202 includes eight planes.

Figure 4B:
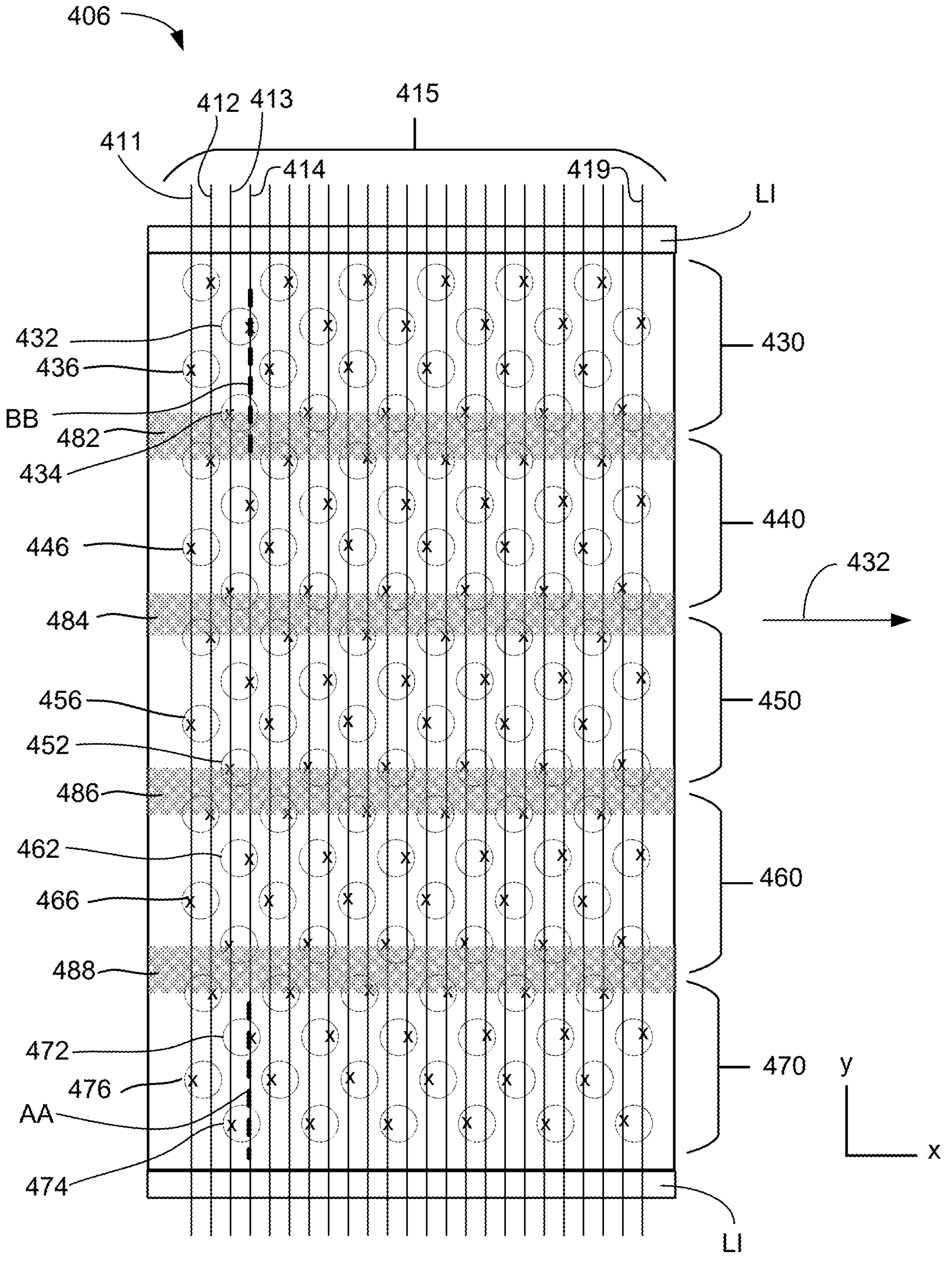
Figure 4B (Prior Art)
FIG. 4B depicts a top view of a portion of one embodiment of a block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an “x” to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
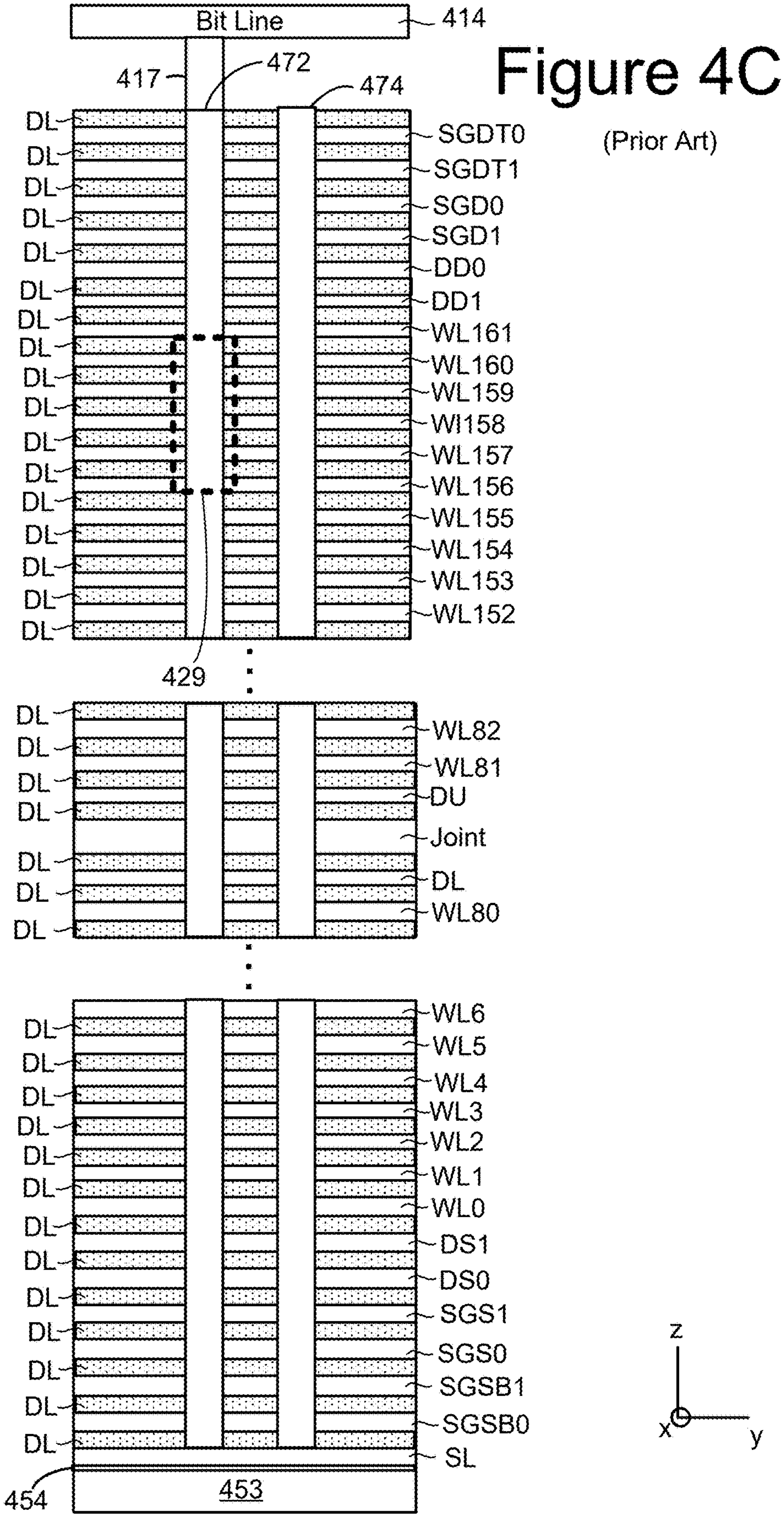
Figure 4C (Prior Art)
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes two drain side select layers SGD0 and SGD1; two source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less number of SGSs (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows two GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL. For example, the GIDL generation transistors have an abrupt pn junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack. As in agreement with FIG. 4B, FIG. 4C show vertical memory hole/column 472 connected to bit line 414 via connector 417.

For ease of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To ease this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
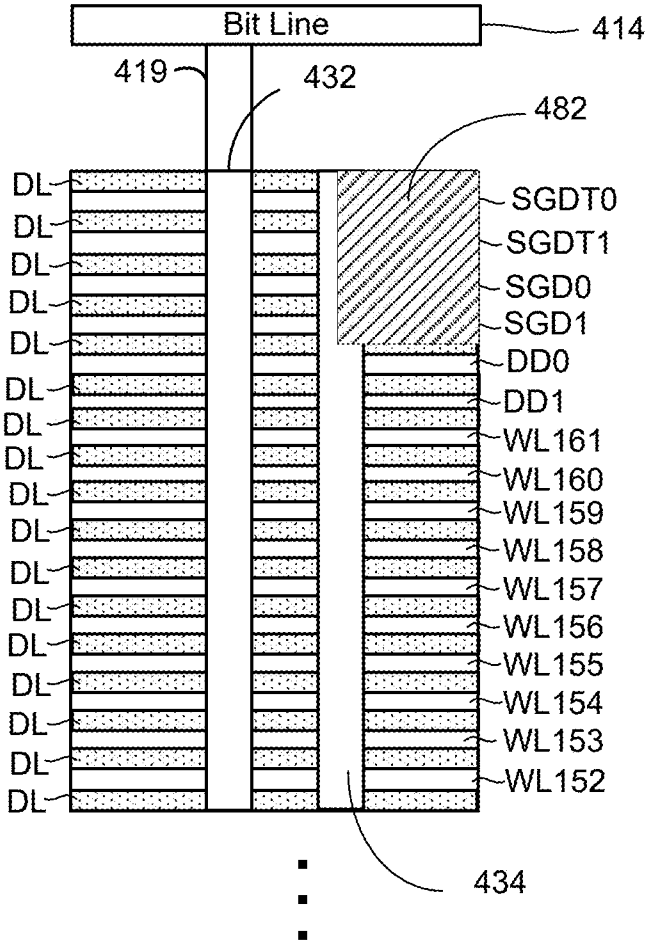
Figure 4D (Prior Art)
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488 occupy space that would have been used for a portion of the memory holes/vertical columns/NAND strings. For example, isolation region 482 occupies space that would have been used for a portion of memory hole/vertical column 434. More specifically, a portion (e.g., half the diameter) of vertical column 434 has been removed in layers SGDT0, SGDT1, SGD0, and SGD1 to accommodate isolation region 482. Thus, while most of the vertical column 434 is cylindrical (with a circular cross section), the portion of vertical column 434 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 430, 440, 450, 460, and 470.

Figure 4E:
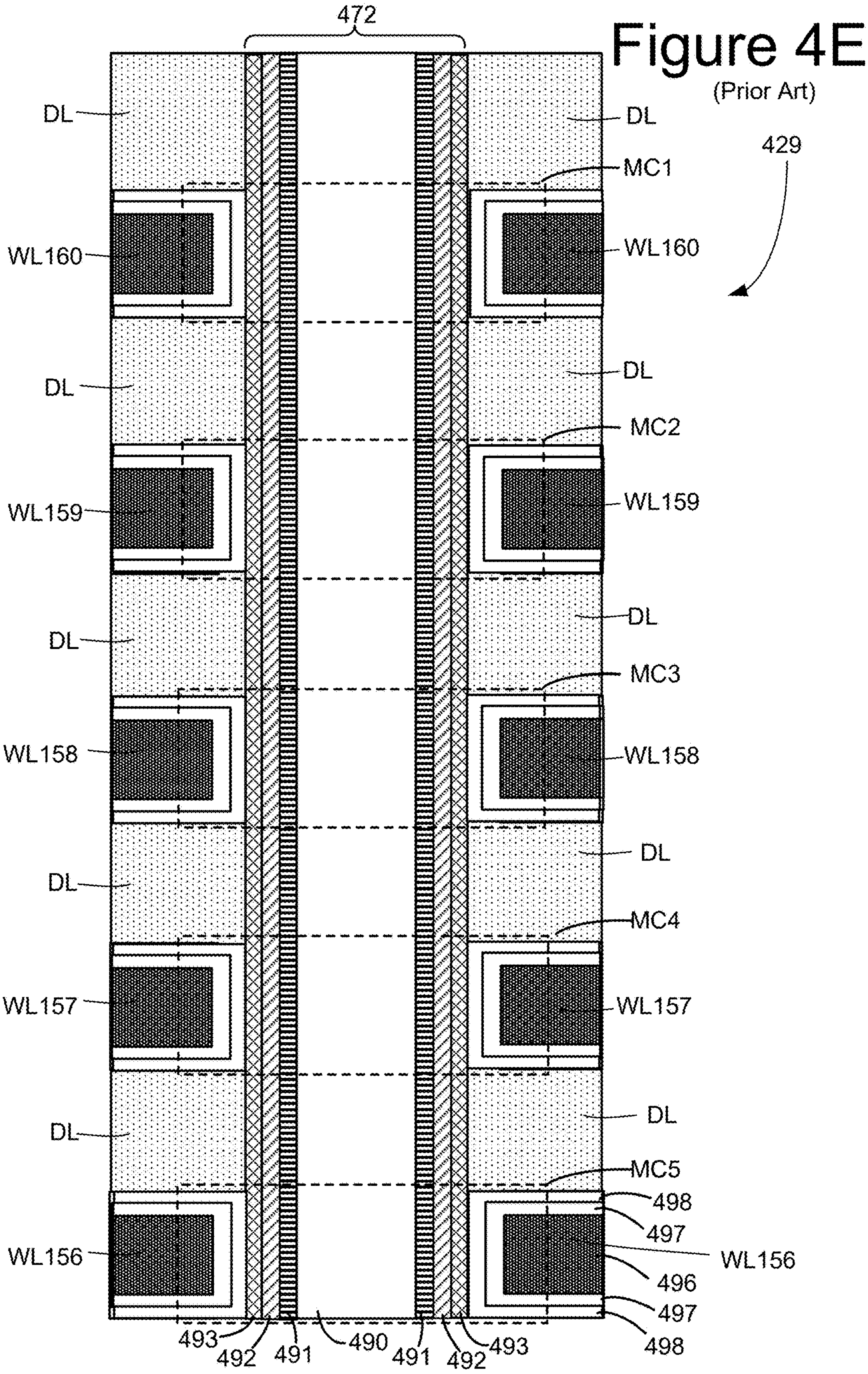
Figure 4E (Prior Art)
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
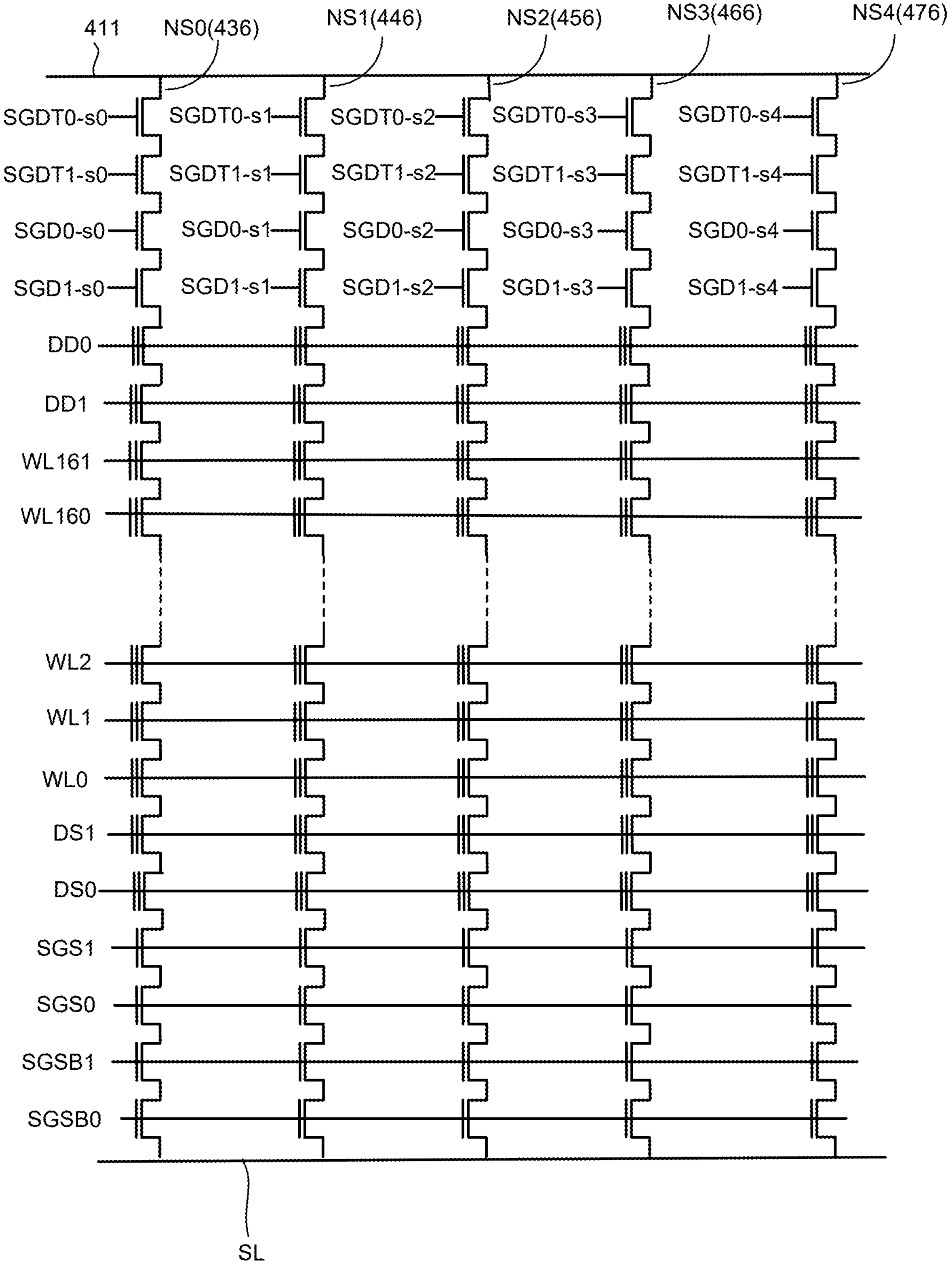
Figure 4F (Prior Art)
FIG. 4F is a schematic of a plurality of NAND strings in multiple regions of a same block.

FIG. 4F is a schematic diagram of a portion of the three dimensional memory array 202 depicted in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings, one in each region of regions 430, 440, 450, 460, 470. Thus, FIG. 4F shows bit line 411 connected to NAND string NS0 (which corresponds to memory hole/vertical column 436 of region 430), NAND string NS1 (which corresponds to memory hole/vertical column 446 of region 440), NAND string NS2 (which corresponds to vertical column 456 of region 450), NAND string NS3 (which corresponds to memory hole/vertical column 466 of region 460), and NAND string NS4 (which corresponds to memory hole/vertical column 476 of region 470).

Drain side select line/layer SGD0 is separated by isolation regions 482, 484, 486 and 488 to form SGD0-*s*0, SGD0-*s*1, SGD0-*s*2, SGD0-*s*3 and SGD0-*s*4 in order to separately connect to and independently control regions 430, 440, 450, 460, 470. Similarly, drain side select line/layer SGD1 is separated by isolation regions 482, 484, 486 and 488 to form SGD1-*s*0, SGD1-*s*1, SGD1-*s*2, SGD1-*s*3 and SGD1-*s*4 in order to separately connect to and independently control regions 430, 440, 450, 460, 470; drain side GIDL generation transistor control line/layer SGDT0 is separated by isolation regions 482, 484, 486 and 488 to form SGDT0-*s*0, SGDT0-*s*1, SGDT0-*s*2, SGDT0-*s*3 and SGDT0-*s*4 in order to separately connect to and independently control regions 430, 440, 450, 460, 470; drain side GIDL generation transistor control line/layer SGDT1 is separated by isolation regions 482, 484, 486 and 488 to form SGDT1-*s*0, SGDT1-*s*1, SGDT1-*s*2, SGDT1-*s*3 and SGDT1-*s*4 in order to separately connect to and independently control regions 430, 440, 450, 460, 470.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D) memory structures can also be used with the technology described herein.

Figure 5A:
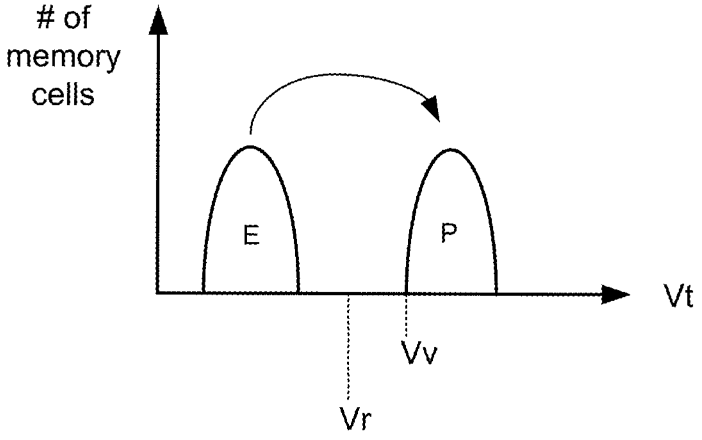
Figure 5A (Prior Art)
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
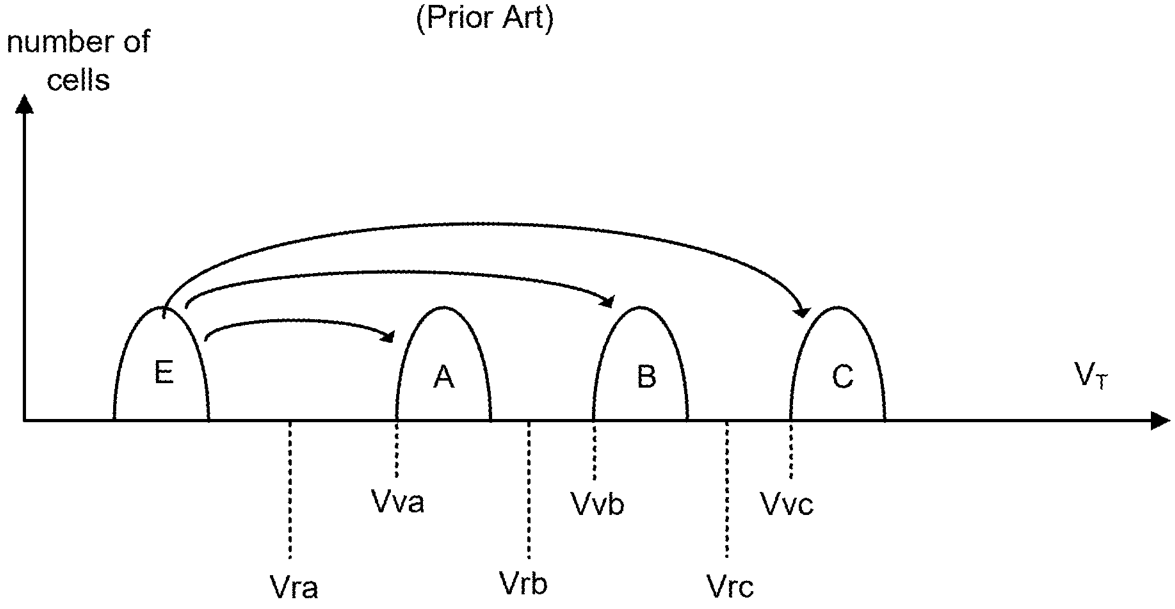
Figure 5B (Prior Art)
FIG. 5B depicts threshold voltage distributions.
Figure 5C:
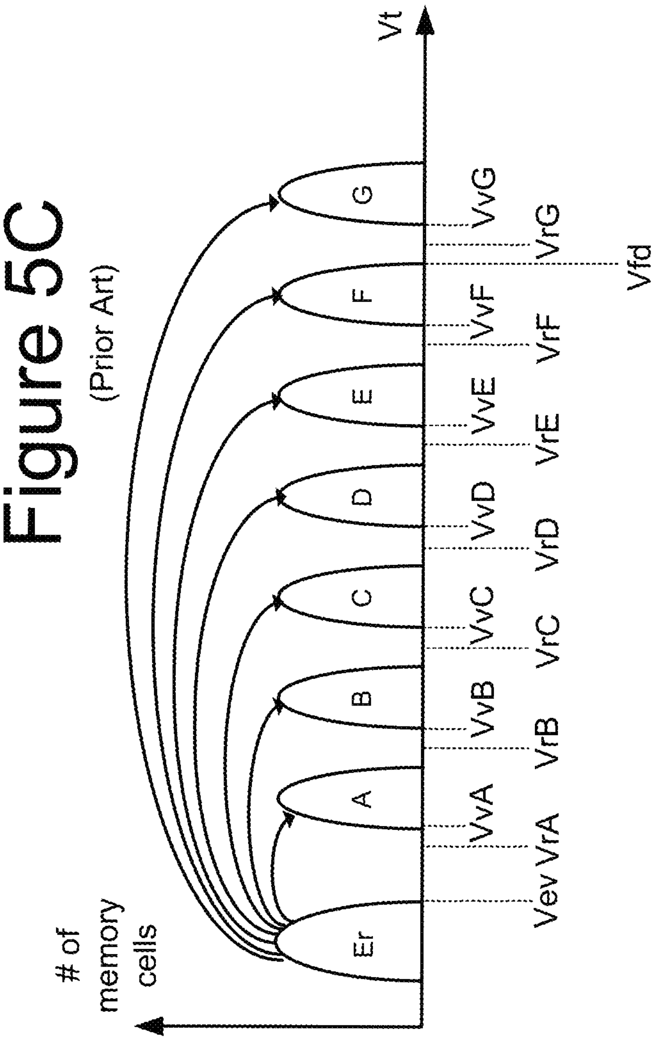
Figure 5C (Prior Art)
FIG. 5C depicts threshold voltage distributions.
Figure 5D:
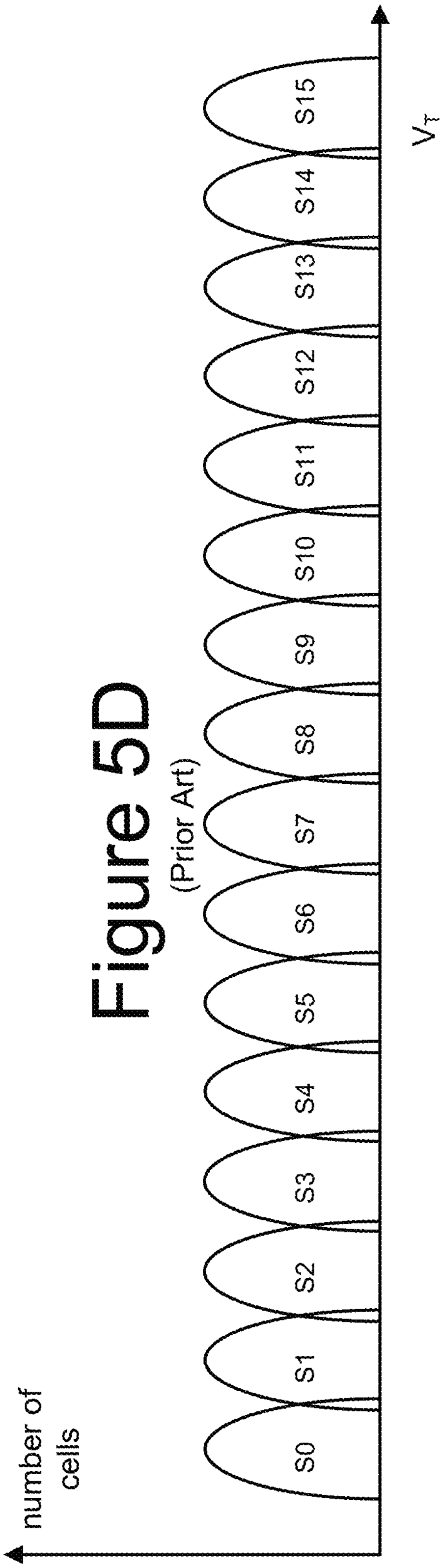
Figure 5D (Prior Art)
FIG. 5D depicts threshold voltage distributions.

FIGS. 5B-D illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

| | E | A | B | C |
|---|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

| | Er | A | B | C | D | E | F | G |
|---|---|---|---|---|---|---|---|---|
| UP | 1 | 1 | 1 | 0 | 0 | 0 | 0 | 1 |
| MP | 1 | 1 | 0 | 0 | 1 | 1 | 0 | 0 |
| LP | 1 | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |
| MP | 1 | 1 | 1 | 0 | 0 | 0 | 0 | 1 | 1 | 0 | 0 | 0 | 0 | 1 | 1 | 1 |
| LP | 1 | 0 | 0 | 0 | 1 | 1 | 0 | 0 | 0 | 0 | 0 | 1 | 1 | 1 | 1 | 1 |

Figure 5E:
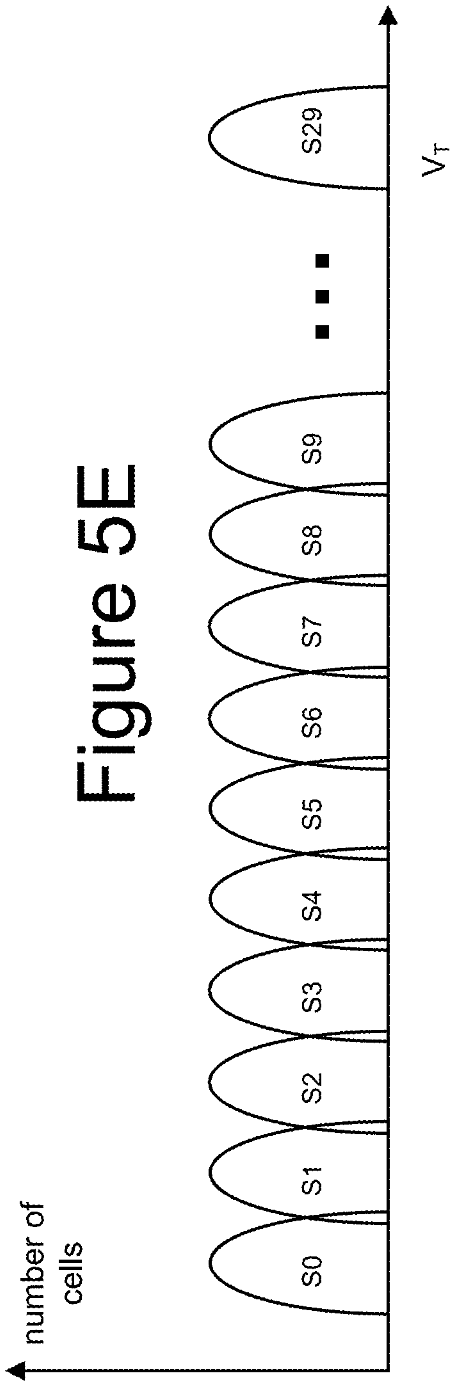
FIG. 5E depicts threshold voltage distributions.

FIG. 5E depicts threshold voltage distributions for a memory system that stores data in thirty data states S0-S29. In one embodiment, each memory cell stores five bits of data, which is another example of MLC data. FIG. 5D depicts that there may be some overlap between the threshold voltage distributions (data states) S0-S29. In other embodiments, there is no overlap between the threshold voltage distributions.

Figure 6:
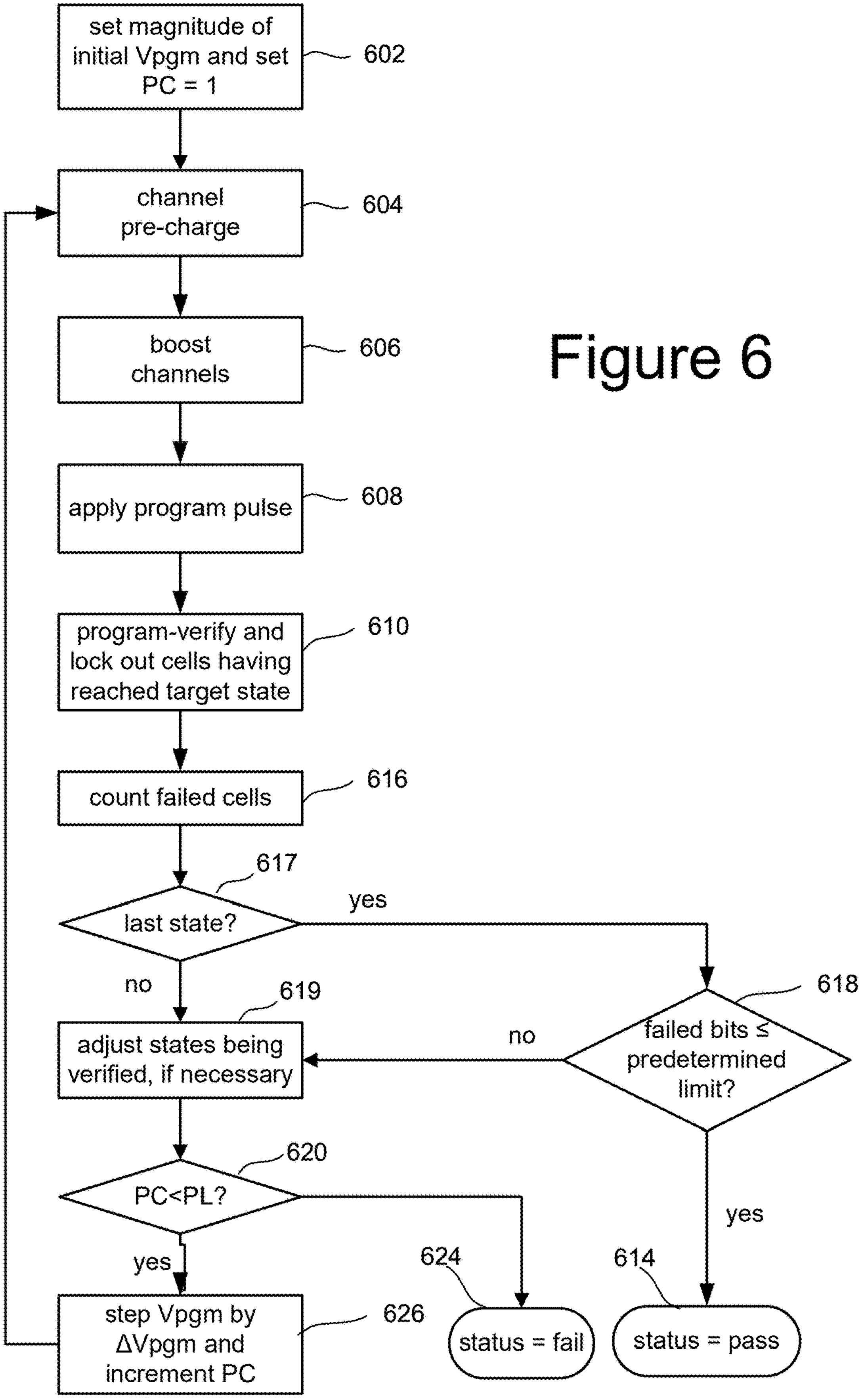
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

In one embodiment of step 610, a smart verify technique is used such that the system only verifies a subset of data states during a program loop (steps 604-626). For example, the first program loop includes verifying for data state A (see FIG. 5C), depending on the result of the verify operation the second program loop may perform verify for data states A and B, depending on the result of the verify operation the third program loop may perform verify for data states B and C, and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D. In one embodiment, the control circuit is configured to program memory cells in the direction from the erased data state toward the highest data state (e.g., from data state Er to data state G) and erase memory cells in the direction from the highest data state toward the erased data state (e.g., from data state G to data state Er).

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGSB0, and SGSB1). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1) that is connected to or near a bit line to generate a first GIDL current. A second GIDL voltage may be created between two terminals of a GIDL generation transistor (e.g., SGSB0, SGSB1) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

Figure 7:
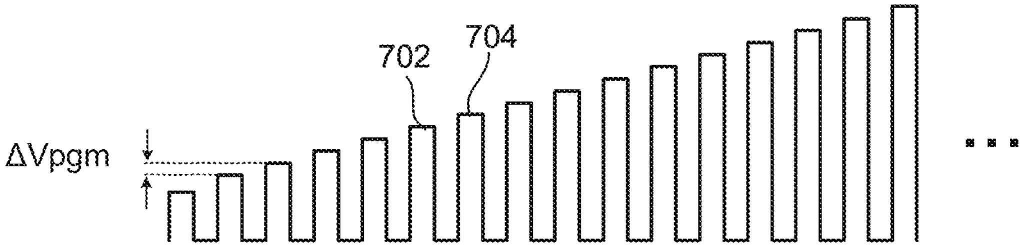
FIG. 7 depicts voltage signals applied to a selected word line during programming.
Figure 8A:
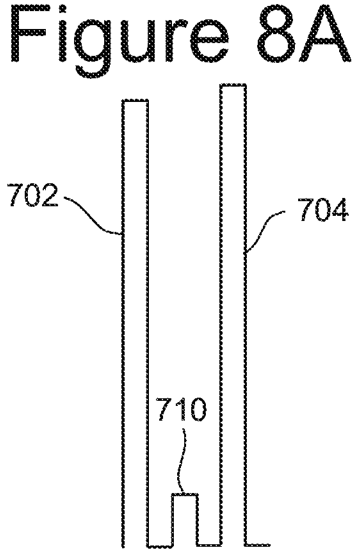
FIG. 8A depicts two program voltage pulses applied to a selected word line during programming and a verify voltage pulse between the two program voltage pulses.
Figure 8B:
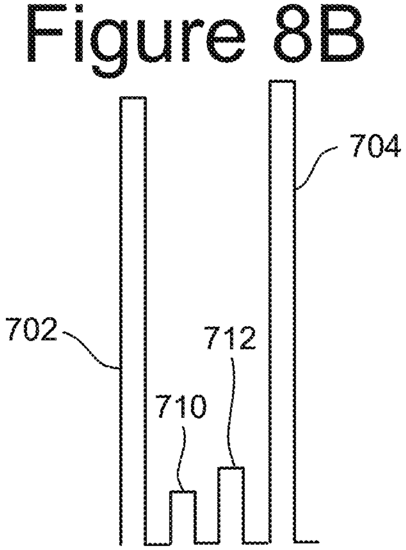
FIG. 8B depicts two program voltage pulses applied to a selected word line during programming and a verify voltage pulse between the two program voltage pulses.

FIG. 7 depicts the programming signal Vpgm as a series of program voltage pulses, such that one pulse of the programming signal Vpgm is applied at each performance of step 608 of FIG. 6. These program voltage pulses are one example of doses of programming applied to a plurality of non-volatile memory cells being programmed. In one embodiment, the program voltage pulses increase in voltage magnitude from pulse-to-pulse by a step size ΔVpgm. In some embodiments, ΔVpgm can change during a programming process. As described by FIG. 6, the system performs program-verification between the doses of programming (between or after program voltage pulses), as depicted in FIGS. 8A and 8B. FIG. 8A, which illustrates an example in which program-verify is performed for one verify level, depicts two of the program voltage pulses 702 and 704 of FIG. 7. Between program voltage pulses 702 and 704 is verify voltage pulse 710. In one embodiment, verify voltage pulse 710 has a magnitude of any of the verify reference voltages VvA, VvB, VvC, VvD, VvE, VvF, and VvG (see FIG. 5C) and represents the system performing program-verify (step 610) between the doses of programming (successive iterations of step 608). In some embodiments, between program voltage pulses the system will perform program-verify for multiple or all data states, while in other embodiments the system will perform program-verify for one data state at a time or a subset of data states. FIG. 8B, which illustrates an example in which program-verify is performed for two verify levels, depicts two of the program voltage pulses 702 and 704 of FIG. 7. Between program voltage pulses 702 and 704 are verify voltage pulses 710 and 712. In one embodiment, verify voltage pulses 710 and 712 are for different data states.

In one embodiment, the system will perform program-verify at any given time (e.g., between two adjacent pair of program voltage pulses or other doses of programming) for a subset of data states. For example, when programming starts, the system will only perform program-verify for data state A (see e.g., FIG. 5C). After at least a first amount of memory cells have successfully reached VvA, the verify reference voltage for data state A (see FIG. 5C), then the system will only perform program-verify for data state A and data state B. After at least a first amount of memory cells have successfully reached VvB, the verify reference voltage for data state B (see FIG. 5C), then the system will only perform program-verify for data state A, data state B and data state C. The system will stop performing program-verify for data state A when all (or sufficient number of) memory cells targeted to data state A have successfully verified for data state A. And so on.

Multiply and accumulate operations are a basic operation in the implementation of machine learning algorithms, such as neural networks. Such operations typically involve extremely large amounts of data and large numbers of operations. As such, they are extremely computationally intensive, involving large numbers of data transfers and consuming large amounts of time and power. A basic operation for these computations is vector-matrix multiplication. Vector-matrix multiplication can be efficiently performed by computing within non-volatile memory, in which the matrices are programed into a non-volatile memory and the input vectors applied as bias levels to the arrays of the memory device. Compute in memory vector-matrix multiplication can be implemented in both binary valued embodiments and analog or multi-bit embodiments.

Figure 9:
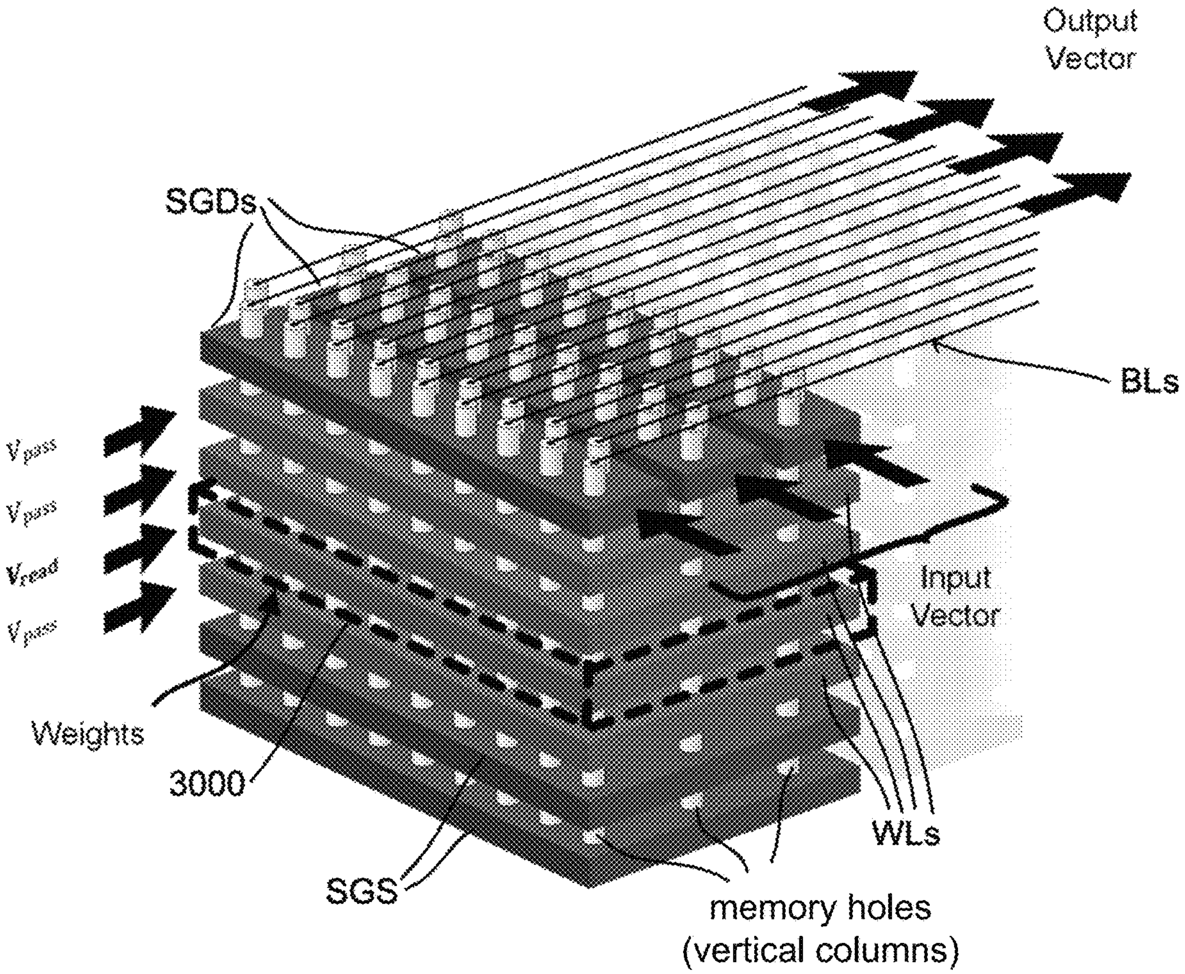
FIG. 9 depicts a portion of a memory structure.

FIG. 9 illustrates one example arrangement for vector-matrix multiplication using non-volatile memory (such as the structures of FIGS. 1-4F) in which the matrix values are stored on in non-volatile memory cells on word line layers. In the arrangement of FIG. 9, the matrix values, such as neural network weights, are stored (in memory cells) and accessed on a word line by word line basis. For example, to access a set of weights stored on a word line 3000, the select function is implemented by the word line bias levels, with the selected word line biased at Vread, and the other unselected word lines biased at read by-pass voltage Vpass. The input vector is then applied horizontally, with the different components applied to different drain side select gates (e.g., SGD0 and/or SGD1) to select different regions of the 3D NAND structure. A read operation is performed, that comprises sensing current through the selected memory cells such that the weights stored in the selected memory cells are multiplied by the input vector to produce output current that define the output vector. The output vector values are then collected on the bit lines using the sense amplifiers. In this manner, the read operation comprises performing an artificial intelligence inference operation (e.g., matrix multiplication). Thus, the approach of FIG. 9 can be used for computing the product of a dynamic input vector and a static weight matrix in neural networks. In such an arrangement, the weights are programmed into the memory cells. In one embodiment, the programming of the weights can include programming the memory cells to any of thirty data states, such as S0-S29 of FIG. 5E.

Figure 10:
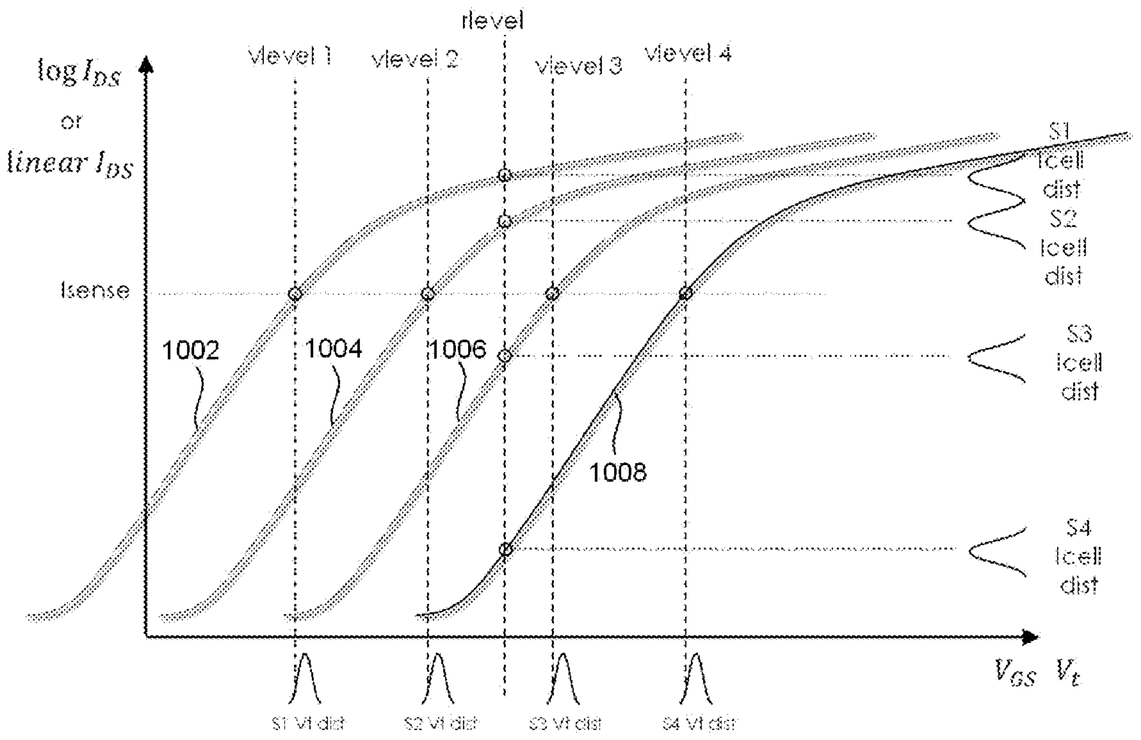
FIG. 10 depicts a graph with I/V curves for different data states.

In prior memory systems deployed to store data other than neural network weights or other matrix values, the program-verify operation comprises programming until a memory cell's threshold voltage reaches the appropriate verify reference voltage (e.g., VvA, VvB, VvC, VvD, VvE, VvF, and VvG of FIG. 5C) and reading comprises determining whether memory cells' threshold voltages are above or below the read reference voltage (e.g., VrA, VrB, VrC, VrD, VrE, VrF, and VrG of FIG. 5C). In these prior memory systems, the program-verify operation and the read operation are both performed by sensing a common current (Isense). This arrangement is depicted in FIG. 10 which shows I/V curves for memory cells being programmed to data states S1, S2, S3 and S4 of data states S0-S29 of FIG. 5E. I/V curve 1002 is for memory cells programmed to data state S1, I/V curve 1004 is for memory cells programmed to data state S2, I/V curve 1006 is for memory cells programmed to data state S3, and I/V curve 1008 is for memory cells programmed to data state S4. In one embodiment, program-verify comprises programming until a memory cell's threshold voltage is sensed to have reached the appropriate verify reference voltage, including programming memory cells targeted for data state S1 until their threshold voltage reaches the verify reference voltage of vlevel 1, programming memory cells targeted for data state S2 until their threshold voltage reaches the verify reference voltage of vlevel 2, programming memory cells targeted for data state S3 until their threshold voltage reaches the verify reference voltage of vlevel 3, and programming memory cells targeted for data state S4 until their threshold voltage reaches the verify reference voltage of vlevel 4. Sense amplifiers 230 sense whether threshold voltages have reached the target verify reference voltage by sensing whether the current through the memory cells being programmed has reached Isense in response to applying the target verify reference voltage to the control gate of the memory cell (e.g., via the selected word line).

In one set of embodiments that store neural network weights or other matrix values in the memory cells and the read operations comprise sensing output current to implement artificial intelligence inference operations or matrix multiplication, the read operation (e.g., artificial intelligence inference operations or matrix multiplication) comprises applying a common voltage (labeled as rlevel in FIG. 10) to all memory cells being sensed (selected for the inference operation or matrix multiplication), regardless of data state. FIG. 10 shows the intersection of the I/V curves 1002/1004/1006/1008 with Isense is different than the intersection of the I/V curves 1002/1004/1006/1008 with rlevel. the difference in intersection points for a same I/V curve indicates that the memory cells are being program-verified at a different voltage and current than the voltage and current used for sensing during the read operation (e.g., artificial intelligence inference operations or matrix multiplication). This difference can lead to errors in the data during the read operation (e.g., artificial intelligence inference operation or matrix multiplication). Thus, it is proposed to use the same voltage level and currents sensed for both program-verify and the read operation (e.g., artificial intelligence inference operation or matrix multiplication).

Figure 11:
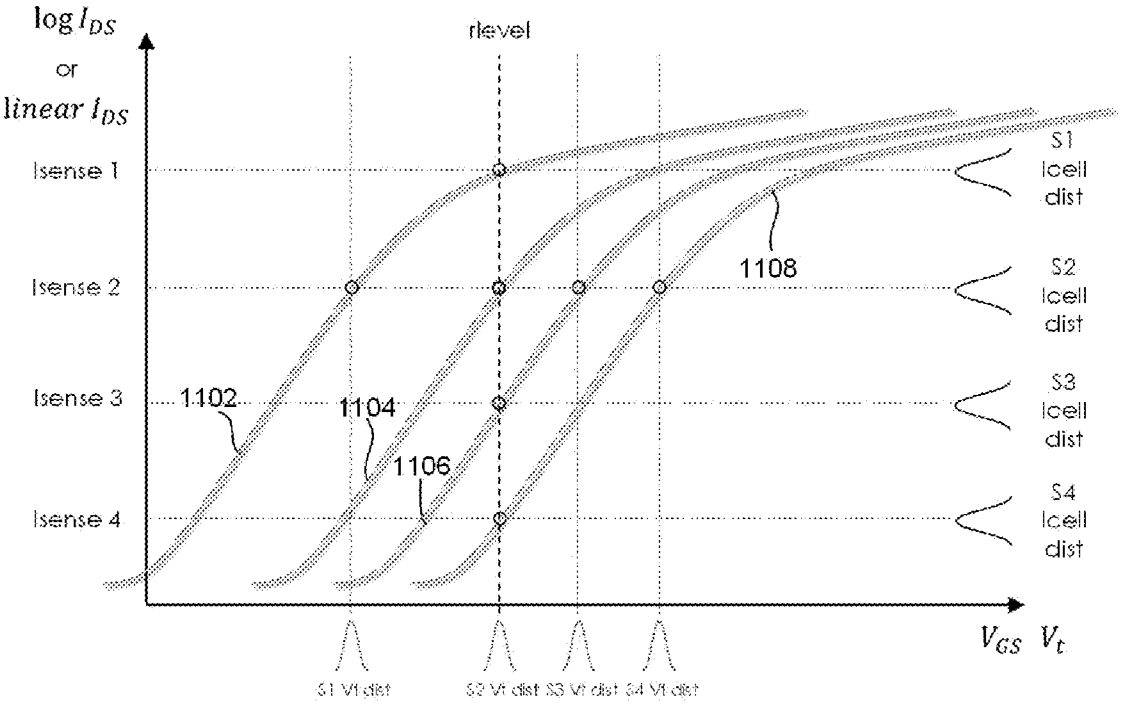
FIG. 11 depicts a graph with I/V curves for different data states.

FIG. 11 depicts I/V curves for memory cells being programmed to data states S1, S2, S3 and S4 of S0-S29 of FIG. 5E in an embodiment that uses the same voltage level and currents sensed for both program-verify and the read operation (e.g., artificial intelligence inference operation or matrix multiplication). I/V curve 1102 is for memory cells programmed to data state S1, I/V curve 1104 is for memory cells programmed to data state S2, I/V curve 1106 is for memory cells programmed to data state S3, and I/V curve 1108 is for memory cells programmed to data state S4. Memory cells being programmed to all data states (including S1-S4) are programmed by applying the set of programming pulses (see e.g., FIG. 7) to the selected word line connected to the memory cells being programmed and program-verify is performed by applying rlevel to the control gate for the memory cells (via the word line) for verifying for all data states of the multiple data states being verified and sensing for different current levels for different data states of the multiple data states between program voltage pulses. Performing a read operation (e.g., artificial intelligence inference operation or matrix multiplication) comprises applying rlevel (e.g., Vread) to the selected word lines and sensing current in response to applying rlevel to the selected word line. In this manner, the program-verify operation and the read operation are performed using the same voltage at the control gate and the same current sensing through the selected memory cell(s). For example, during program-verify, memory cells being programmed to data state S1 will be sensed at Isense 1, memory cells being programmed to data state S2 will be sensed at Isense 2, memory cells being programmed to data state S3 will be sensed at Isense 3, and memory cells being programmed to data state S4 will be sensed at Isense 4. During a read operation (e.g., artificial intelligence inference operation or matrix multiplication), memory cells programmed to data state S1 will be sensed at Isense 1, memory cells programmed to data state S2 will be sensed at Isense 2, memory cells programmed to data state S3 will be sensed at Isense 3, and memory cells programmed to data state S4 will be sensed at Isense 4.

Figure 12:
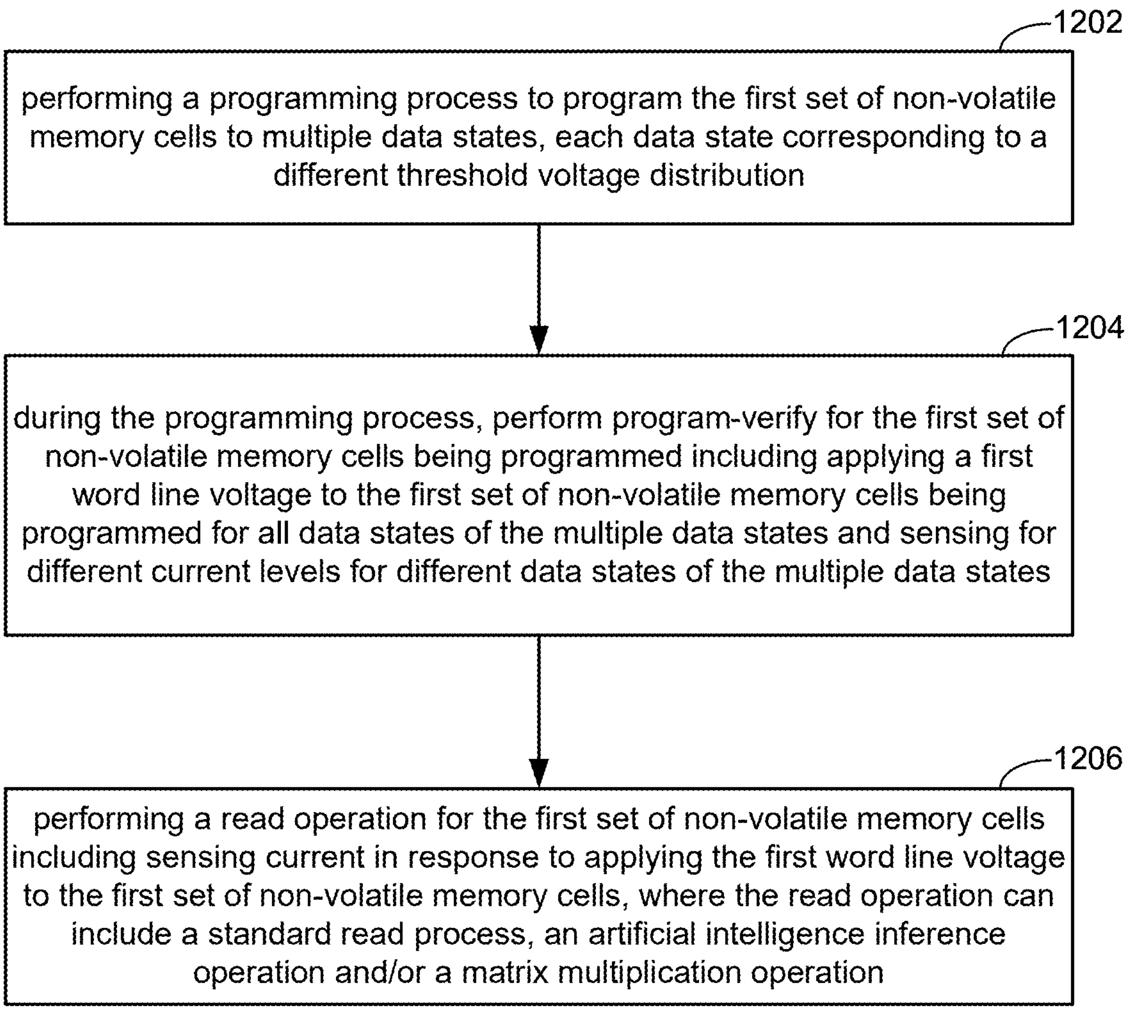
FIG. 12 is a flow chart describing one embodiment of a process for operating non-volatile memory.

FIG. 12 is a flow chart describing one embodiment of a process for operating non-volatile memory that uses the same voltage level and currents sensed for both program-verify and the read operation (e.g., artificial intelligence inference operation or matrix multiplication) in accordance with the embodiment of FIG. 11. In some example implementations, the process of FIG. 12 can be performed by any one of the one or more control circuits discussed above. The process of FIG. 12 can be performed entirely by a control circuit on memory die 200 (see FIG. 2A) or entirely by a control circuit on integrated memory assembly 207 (see FIG. 2B), rather than by memory controller 120. In one example, the process of FIG. 12 is performed by or at the direction of state machine 262, using other components of System Control Logic 260, Column Control Circuitry 210 and Row Control Circuitry 220. In another embodiment, the process of FIG. 12 is performed by memory controller 120 in combination with System Control Logic 260, Column Control Circuitry 210 and Row Control Circuitry 220. In some embodiments, the process of FIG. 12 can be performed on any of the non-volatile memories discussed above.

Step 1202 of FIG. 12 includes performing a programming process to program the first set of non-volatile memory cells to multiple data states, each data state corresponding to a different threshold voltage distribution. For example, the process of FIG. 6 can be used with the waveform of FIG. 7 to program memory cells to data states S0-S29 (FIG. 5E). In one embodiment, the first set of non-volatile memory cells are all connected to the first word line and are positioned on different vertical NAND strings of a three dimensional non-volatile memory structure. In step 1204, during the programming process, the control circuit performs program-verify for the first set of non-volatile memory cells being programmed including applying a first word line voltage (e.g., rlevel) to the first set of non-volatile memory cells being programmed for all data states of the multiple data states (regardless of which data state the respective non-volatile memory cells is being programmed to) and sensing for different current levels for different data states of the multiple data states. For example, the control circuit senses for Isense 1 for data state S1, the control circuit senses for Isense 2 for data state S2, the control circuit senses for Isense 3 for data state S3, and the control circuit senses for Isense 4 for data state S4. In one embodiment, the control circuit is configured to sense for different current levels for different data states of the multiple data states by sensing at different sense times for different data states of the multiple data states. Step 1206 includes the control circuit performing a read operation for the first set of non-volatile memory cells including sensing current in response to applying the first word line voltage (e.g., rlevel) to all memory cells of the first set of non-volatile memory cells, where the read operation can include a standard read process, an artificial intelligence inference operation and/or a matrix multiplication operation.

One embodiment includes a second set of non-volatile memory cells connected to the control circuit and a set of bit lines. Each bit line of the set of bit lines is connected to one non-volatile memory cell of the first set of non-volatile memory cells and one non-volatile memory cell of the second set of non-volatile memory cells; for example, the first set of non-volatile memory cells the second set of non-volatile memory cells are in different regions of the same block (see e.g., regions 430-470 of FIG. 4B), each bit line is connected to one sense amplifier and each bit line/sense amplifier pair is connected to one NAND string in each region so that if there are five regions 430-470 each bit line/sense amplifier pair is connected to five NAND strings in each block. The control circuit is further configured to perform a read operation for the first set of non-volatile memory cells and the second set of non-volatile memory cells by the sense amplifier(s) concurrently sensing current in response to applying the first word line voltage to the first set of non-volatile memory cells and to the second set of non-volatile memory cells such that each bit line/sense amplifier pair concurrently receives current from one non-volatile memory cell of the first set of non-volatile memory cells and one non-volatile memory cell of the second set of non-volatile memory cells.

Figure 13:
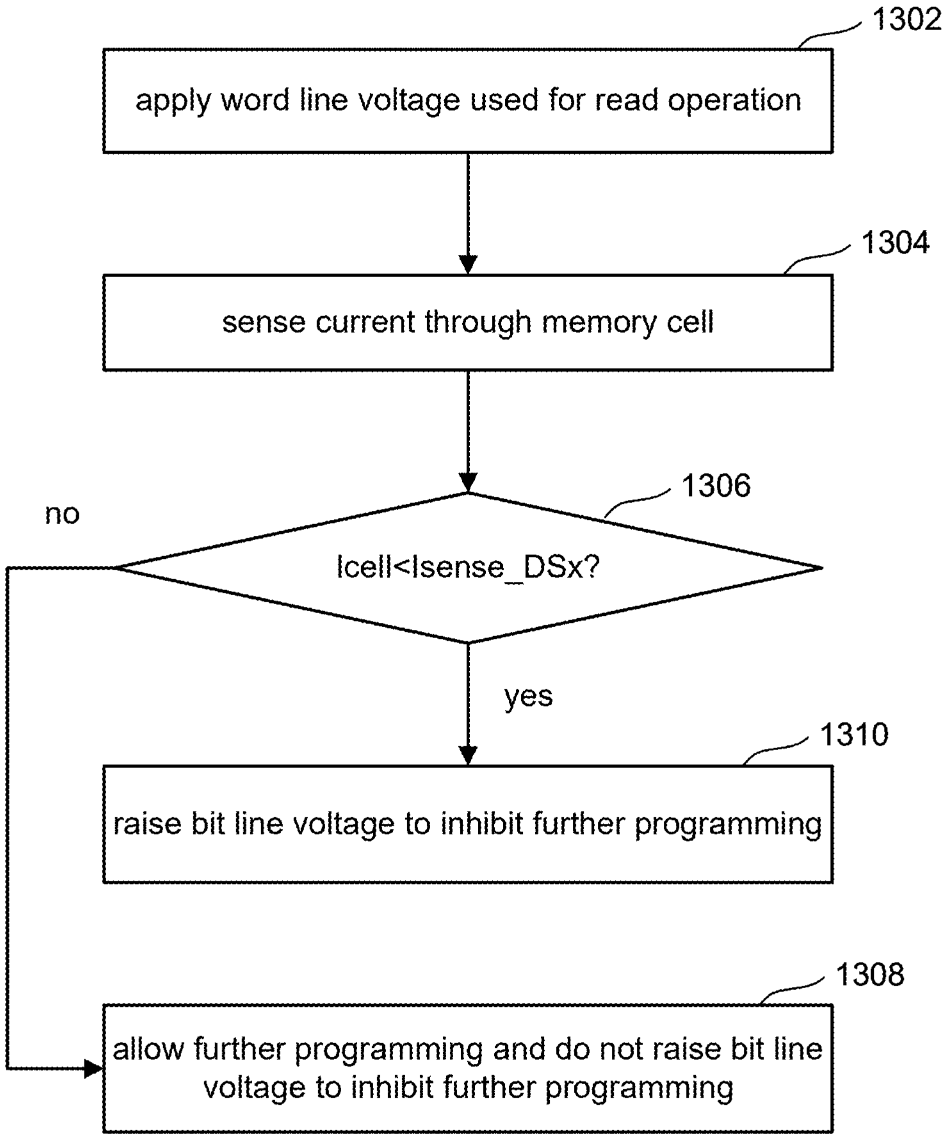
FIG. 13 is a flow chart describing one embodiment of a process for operating non-volatile memory.

FIG. 13 is a flow chart describing one embodiment of a process for performing program-verify for the embodiment that uses the same voltage level and currents sensed for both program-verify and the read operation (e.g., artificial intelligence inference operation or matrix multiplication). Thus, the process of FIG. 13 can be used during step 1204 of FIG. 12. The process of FIG. 13 can also be used during step 610 of FIG. 6. In some example implementations, the process of FIG. 13 can be performed by any one of the one or more control circuits discussed above. The process of FIG. 13 can be performed entirely by a control circuit on memory die 200 (see FIG. 2A) or entirely by a control circuit on integrated memory assembly 207 (see FIG. 2B), rather than by memory controller 120. In one example, the process of FIG. 13 is performed by or at the direction of state machine 262, using other components of System Control Logic 260, Column Control Circuitry 210 and Row Control Circuitry 220. In another embodiment, the process of FIG. 13 is performed by memory controller 120 in combination with System Control Logic 260, Column Control Circuitry 210 and Row Control Circuitry 220.

In step 1302, the control circuit applies a word line voltage to the word line(s) selected for programming. The memory cells being programmed are connected to the word line(s) selected for programming. The voltage applied to the word line(s) selected for programming is the same voltage applied to the word lines during a read operation. In one example, step 1302 comprises applying rlevel (see FIG. 11) to the word line(s) selected for programming. In step 1304, the control circuit senses current through the memory cell(s) being verified. If (step 1306) the current sensed (Icell) through a memory cell is less than the target current for the data state that the memory cell is being programmed to (Isense_DSx), then the memory cell has reached its target threshold voltage and (in step 1310) the memory cell is inhibited from further programming by (for example) raising the bit line voltage for that memory cell. If (step 1306) the current sensed (Icell) through a memory cell is not less than the target current for the data state that the memory cell is being programmed to (Isense_DSx), then the memory cell has not yet reached its target threshold voltage and (in step 1308) the memory cell is allowed to continue further programming, as the bit line voltage for that memory cell is not raised to inhibit further programming. For example, if a memory cell is being programmed to data state S2 and step 1304 includes sensing a current that is greater than Isense 2, then the control circuit does not raise the bit line voltage and allows the memory cell to continue programming (step 1308). If a memory cell is being programmed to data state S3 and step 1304 includes sensing a current that is less than Isense 3, then the control circuit raises the bit line voltage (step 1310) and inhibits the memory cell from further programming.

A memory system has been described that uses the same word line voltage for verifying and reading multiple (or all) data states such that both program-verify and read operations comprise sensing for different current levels in response to the same word line voltage.

One embodiment includes a non-volatile storage apparatus, comprising: a first set of non-volatile memory cells and a control circuit connected to the first set of non-volatile memory cells. The control circuit is configured to: perform a programming process to program the first set of non-volatile memory cells to multiple data states, each data state corresponds to a different threshold voltage distribution; and during the programming process, perform program-verify for the first set of non-volatile memory cells including applying a first word line voltage to the first set of non-volatile memory cells for verifying for all data states of the multiple data states being verified and sensing for different current levels for different data states of the multiple data states.

In one example implementation, the control circuit is configured to perform program-verify for the first set of non-volatile memory cells by applying the first word line voltage to the first set of non-volatile memory cells during program-verify regardless of which data state the respective non-volatile memory cells is being programmed to and sensing current at least partially in response to the first word line voltage.

In one example implementation, the control circuit is configured to perform the programming process to program the first set of non-volatile memory cells to multiple data states by applying a set of doses of programming to the first set of non-volatile memory cells; and the control circuit is configured to perform program-verify for the first set of non-volatile memory cells including applying the first word line voltage to the first set of non-volatile memory cells for all data states of the multiple data states and sensing for different current levels for different data states of the multiple data states between doses of programming.

In one example implementation, the control circuit is configured to perform the programming process to program the first set of non-volatile memory cells to multiple data states by applying a set of program voltage pulses to the first set of non-volatile memory cells; and the control circuit is configured to perform program-verify for the first set of non-volatile memory cells including applying the first word line voltage to the first set of non-volatile memory cells for all data states of the multiple data states and sensing for different current levels for different data states of the multiple data states between program voltage pulses.

One example implementation further comprises a first word line. The first set of non-volatile memory cells are all connected to the first word line.

In one example implementation, the control circuit is configured to perform a read operation for the first set of non-volatile memory cells including sensing current in response to applying the first word line voltage to the first set of non-volatile memory cells.

In one example implementation, the control circuit is configured to perform an artificial intelligence inference operation for the first set of non-volatile memory cells including sensing current in response to applying the first word line voltage to the first set of non-volatile memory cells.

In one example implementation, the control circuit is configured to perform a matrix multiplication operation with the first set of non-volatile memory cells including sensing current in response to applying the first word line voltage to the first set of non-volatile memory cells.

In one example implementation, the control circuit is configured to sense for different current levels for different data states of the multiple data states by sensing at different sense times for different data states of the multiple data states.

In one example implementation, the first set of non-volatile memory cells are positioned on different vertical NAND strings of a three dimensional non-volatile memory structure.

One example implementation further comprises a second set of non-volatile memory cells connected to the control circuit and a set of bit lines. Each bit line of the set of bit lines is connected to one non-volatile memory cell of the first set of non-volatile memory cells and one non-volatile memory cell of the second set of non-volatile memory cells. The control circuit is further configured to perform a read operation for the first set of non-volatile memory cells and the second set of non-volatile memory cells by concurrently sensing current in response to applying the first word line voltage to the first set of non-volatile memory cells and to the second set of non-volatile memory cells such that each bit line concurrently receives current from one non-volatile memory cell of the first set of non-volatile memory cells and one non-volatile memory cell of the second set of non-volatile memory cells. In one example implementation, the control circuit comprises a plurality of sense amplifiers connected to the bit lines such that during a read operation each sense amplifier of the plurality of sense amplifiers receives and reads current from one non-volatile memory cell of the first set of non-volatile memory cells and one non-volatile memory cell of the second set of non-volatile memory cells. In one example implementation, the first set of non-volatile memory cells and the second set of non-volatile memory cells are connected to a first word line.

One embodiment comprises a method comprising: performing a programming process to program a first set of non-volatile memory cells to multiple data states, each data state corresponding to a different threshold voltage distribution; and during the programming process, performing program-verify for the first set of non-volatile memory cells being programmed including applying a same word line voltage to the first set of non-volatile memory cells being programmed for verifying for all of the data states being verified and sensing at different sense times for different data states of the multiple data states.

In one example implementation, the performing program-verify for the first set of non-volatile memory cells being programmed includes applying the same word line voltage to the first set of non-volatile memory cells being programmed during program-verify regardless of which data state the respective non-volatile memory cells is being programmed to and sending current at least partially in response to the first word line voltage.

In one example implementation, the performing a programming process comprises applying a set of doses of programming to the first set of non-volatile memory cells; and the performing program-verify comprises applying the same word line voltage to the first set of non-volatile memory cells being programmed for all data states and sensing for different current levels for different data states between doses of programming.

One example implementation further comprises performing a read operation for the first set of non-volatile memory cells including sensing current in response to applying the first word line voltage to the first set of non-volatile memory cells.

In one example implementation, the read operation comprises an artificial intelligence inference operation for the first set of non-volatile memory cells including sensing current in response to applying the first word line voltage to the first set of non-volatile memory cells.

In one example implementation, the read operation comprises a matrix multiplication operation with the first set of non-volatile memory cells including sensing current in response to applying the first word line voltage to the first set of non-volatile memory cells.

One embodiment includes a non-volatile storage apparatus, comprising: a first word line; a plurality of non-volatile memory cells connected to a first word line; and a control circuit connected to the first word line and the first set of non-volatile memory cells. The control circuit is configured to: apply a set of doses of programming to the first set of non-volatile memory cells connected to the first word line to program the first set of non-volatile memory cells to multiple data states, each data state corresponding to a different threshold voltage distribution, between doses of programming, perform program-verify for the first set of non-volatile memory cells being programmed including applying a first word line voltage to the first word line for verifying for all data states being verified and sensing at different sense times for each data state of all of the data states being verified, and perform a read operation for the first set of non-volatile memory cells including sensing current in response to applying the first word line voltage to the first word line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
- a first set of non-volatile memory cells;
- a second set of non-volatile memory cells;
- a set of bit lines, each bit line of the set of bit lines is connected to one non-volatile memory cell of the first set of non-volatile memory cells and one non-volatile memory cell of the second set of non-volatile memory cells; and
- a control circuit connected to the first set of non-volatile memory cells and the second set of non-volatile memory cells and the set of bit lines, the control circuit is configured to:
  - perform a programming process to program the first set of non-volatile memory cells to multiple data states, each data state corresponds to a different threshold voltage distribution,
  - during the programming process, perform program-verify for the first set of non-volatile memory cells including applying a first word line voltage to the first set of non-volatile memory cells for verifying for all data states of the multiple data states being verified and sensing for different current levels for different data states of the multiple data states in response to the first word line voltage being applied to the first set of non-volatile memory cells, and
  - perform a read operation for the first set of non-volatile memory cells and the second set of non-volatile memory cells by sensing current in response to concurrently applying the first word line voltage to the first set of non-volatile memory cells and to the second set of non-volatile memory cells such that each bit line concurrently receives current from one non-volatile memory cell of the first set of non-volatile memory cells and one non-volatile memory cell of the second set of non-volatile memory cells in response to concurrently applying the first word line voltage to the first set of non-volatile memory cells and to the second set of non-volatile memory cells.

2. The non-volatile storage apparatus of claim 1, wherein:

the control circuit is configured to perform program-verify for the first set of non-volatile memory cells by applying the first word line voltage to the first set of non-volatile memory cells during program-verify regardless of which data state the respective non-volatile memory cells is being programmed to and sensing current in response to the first word line voltage.

3. The non-volatile storage apparatus of claim 1, wherein:

the control circuit is configured to perform the programming process to program the first set of non-volatile memory cells to multiple data states by applying a set of doses of programming to the first set of non-volatile memory cells; and the control circuit is configured to perform program-verify for the first set of non-volatile memory cells including applying the first word line voltage to the first set of non-volatile memory cells for all data states of the multiple data states and sensing for different current levels for different data states of the multiple data states between doses of programming.

4. The non-volatile storage apparatus of claim 1, wherein:

the control circuit is configured to perform the programming process to program the first set of non-volatile memory cells to multiple data states by applying a set of program voltage pulses to the first set of non-volatile memory cells; and the control circuit is configured to perform program-verify for the first set of non-volatile memory cells including applying the first word line voltage to the first set of non-volatile memory cells for all data states of the multiple data states and sensing for different current levels for different data states of the multiple data states between program voltage pulses.

5. The non-volatile storage apparatus of claim 1, further comprising:

a first word line, the first set of non-volatile memory cells are all connected to the first word line; and the control circuit is configured to apply the first word line voltage to the first word line.

6. The non-volatile storage apparatus of claim 1, wherein:

the read operation is an artificial intelligence inference operation for the first set of non-volatile memory cells and the second set of non-volatile memory cells.

7. The non-volatile storage apparatus of claim 1, wherein:

the read operation is a matrix multiplication operation, with the first set of non-volatile memory cells including sensing current in response to applying the first word line voltage to the first set of non-volatile memory cells.

8. The non-volatile storage apparatus of claim 1, wherein:

the control circuit is configured to sense for different current levels for different data states of the multiple data states by sensing at different sense times for different data states of the multiple data states.

9. The non-volatile storage apparatus of claim 1, wherein:

the control circuit comprises a plurality of sense amplifiers connected to the bit lines such that during the read operation each sense amplifier of the plurality of sense amplifiers receives and reads current from one non-volatile memory cell of the first set of non-volatile memory cells and one non-volatile memory cell of the second set of non-volatile memory cells.

10. The non-volatile storage apparatus of claim 1, further comprising:

a first word line, the first set of non-volatile memory cells and the second set of non-volatile memory cells are connected to the first word line.

11. The non-volatile storage apparatus of claim 1, wherein:

the first set of non-volatile memory cells are positioned on different vertical NAND strings of a three dimensional non-volatile memory structure.

12. A method, comprising:

performing a programming process to program a first set of non-volatile memory cells to multiple data states, each data state corresponding to a different threshold voltage distribution;

during the programming process, performing program-verify for the first set of non-volatile memory cells being programmed including applying a same first word line voltage to the first set of non-volatile memory cells being programmed for verifying for all of the data states being verified and sensing at different sense times for different data states of the multiple data states in response to the same word line voltage; and performing an artificial intelligence inference operation including concurrently applying the same first word line voltage to the first set of non-volatile memory cells and a second set of non-volatile memory cells and sensing current from the first set of non-volatile memory cells and the second set of non-volatile memory cells by sensing current on a set of bit lines connected to the first set of non-volatile memory cells and the second set of non-volatile memory cells, each bit line of the set of bit lines is connected to one non-volatile memory cell of the first set of non-volatile memory cells and one non-volatile memory cell of the second set of non-volatile memory cells, the sensing current comprises each bit line concurrently receiving current from one non-volatile memory cell of the first set of non-volatile memory cells and one non-volatile memory cell of the second set of non-volatile memory cells in response to concurrently applying the same first word line voltage to the first set of non-volatile memory cells and to the second set of non-volatile memory cells.

13. The method of claim 12, wherein:

the performing program-verify for the first set of non-volatile memory cells being programmed includes applying the same word line voltage to the first set of non-volatile memory cells being programmed during program-verify regardless of which data state the respective non-volatile memory cells is being programmed to and sensing current at least partially in response to the first word line voltage.

14. The method of claim 12, wherein:

the performing a programming process comprises applying a set of doses of programming to the first set of non-volatile memory cells; and the performing program-verify comprises applying the same first word line voltage to the first set of non-volatile memory cells being programmed for all data states and sensing for different current levels for different data states between doses of programming.

15. A non-volatile storage apparatus, comprising:

a first word line;

a bit line;

a plurality of non-volatile memory cells connected to the first word line, multiple non-volatile memory cells of the plurality of non-volatile memory cells are connected to the bit line; and a control circuit connected to the first word line and the first set of non-volatile memory cells and the bit line, the control circuit is configured to:

apply a set of doses of programming to the first set of non-volatile memory cells connected to the first word line to program the first set of non-volatile memory cells to multiple data states, each data state corresponding to a different threshold voltage distribution, between doses of programming, perform program-verify for the first set of non-volatile memory cells being programmed including applying a first word line voltage to the first word line for verifying for all data states being verified and sensing at different current levels for each data state of all of the data states being verified in response to the applying the first word line voltage, and perform a read operation for the first set of non-volatile memory cells including concurrently sensing current from the multiple non-volatile memory cells connected to the bit line in response to applying the first word line voltage to the first word line.

* * * * *